United States Patent
Kuroda et al.

(10) Patent No.: US 10,000,056 B2
(45) Date of Patent: Jun. 19, 2018

(54) SCREEN PRINTING APPARATUS AND PASTE KNEADING METHOD

(71) Applicant: Panasonic Intellectual Property Management Co., Ltd., Osaka (JP)

(72) Inventors: Seiya Kuroda, Yamanashi (JP); Masayuki Mantani, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 14/993,877

(22) Filed: Jan. 12, 2016

(65) Prior Publication Data

US 2016/0200096 A1 Jul. 14, 2016

(30) Foreign Application Priority Data

Jan. 13, 2015 (JP) .................................. 2015-003849
Jan. 13, 2015 (JP) .................................. 2015-003850

(51) Int. Cl.

| | |
|---|---|
| *B41F 15/40* | (2006.01) |
| *B41F 33/16* | (2006.01) |
| *B41M 1/12* | (2006.01) |
| *B41F 15/44* | (2006.01) |
| *B41F 15/08* | (2006.01) |
| *B41F 15/42* | (2006.01) |
| *B41F 15/36* | (2006.01) |
| *H05K 3/12* | (2006.01) |
| *B41F 15/26* | (2006.01) |

(Continued)

(52) U.S. Cl.
CPC .......... *B41F 33/16* (2013.01); *B41F 15/0881* (2013.01); *B41F 15/26* (2013.01); *B41F 15/36* (2013.01); *B41F 15/423* (2013.01); *B41F 15/44* (2013.01); *B41F 15/46* (2013.01); *B41M 1/12* (2013.01); *H05K 3/1233* (2013.01); *H05K 3/3484* (2013.01); *B41P 2215/132* (2013.01)

(58) Field of Classification Search
CPC .......... B41F 15/08; B41F 15/42; B41F 15/46; B41F 33/16; B41F 15/26; B41F 15/36; B41F 15/44; B41F 15/0881; B41F 15/423; B41M 1/12; B41P 2215/132; H05K 3/1233; H05K 3/3484
See application file for complete search history.

(56) References Cited

U.S. PATENT DOCUMENTS

| | | | | |
|---|---|---|---|---|
| 7,096,781 B2* | 8/2006 | Katano | .................... | B41F 15/46 101/123 |
| 2002/0007743 A1* | 1/2002 | Yamasaki | ................. | B41C 1/14 101/129 |

(Continued)

FOREIGN PATENT DOCUMENTS

| | | | |
|---|---|---|---|
| JP | 09-193343 A | 7/1997 | |
| JP | 09-323400 | * 12/1997 | .............. B41F 15/08 |

*Primary Examiner* — Jill Culler
*Assistant Examiner* — Marissa Ferguson Samreth
(74) *Attorney, Agent, or Firm* — Pearne & Gordon LLP

(57) ABSTRACT

A screen printing apparatus includes a pair of clampers that clamp a substrate, a mask plate contacted to the substrate, a pair of squeegees provided above the mask plate vertically, and a squeegee controller that selectively controls one of the pair of squeegees to move in the horizontal direction in abutment against the mask plate so that the selected one of the pair of squeegees slides on the mask plate.

10 Claims, 13 Drawing Sheets

(51) Int. Cl.
*H05K 3/34* (2006.01)
*B41F 15/46* (2006.01)

(56) References Cited

U.S. PATENT DOCUMENTS

| | | | |
|---|---|---|---|
| 2009/0193986 A1* | 8/2009 | Kusunoki | B41F 15/36 101/114 |
| 2010/0242754 A1* | 9/2010 | Nishi | B41F 15/0818 101/123 |
| 2013/0186519 A1* | 7/2013 | Irisawa | B23K 35/025 148/24 |
| 2014/0318394 A1* | 10/2014 | Tomomatsu | B41F 15/0881 101/123 |
| 2015/0283637 A1* | 10/2015 | Gray | H05K 3/1233 228/102 |

* cited by examiner

SCREEN PRINTING APPARATUS AND PASTE KNEADING METHOD

CROSS REFERENCE TO RELATED APPLICATION

This application is based on Japanese Patent Application (No. 2015-003849) filed on Jan. 13, 2015 and Japanese Patent Application (No. 2015-003850) filed on Jan. 13, 2015, the contents of which are incorporated herein by reference. Also, all the references cited herein are incorporated as a whole.

BACKGROUND

1. Technical Field

The present invention relates a screen printing apparatus in which each of squeegees can be slid on a mask plate brought into contact with a substrate to scrape paste to thereby fill pattern openings of the mask plate with the paste, and a paste kneading method performed by the screen printing apparatus.

2. Description of the Related Art

A screen printing apparatus in the background art has a configuration in which squeegees can be slid (moved horizontally in abutment) on a mask plate brought into contact with a substrate so that a pattern formed as openings in the mask plate can be transferred to the substrate. Of the paired squeegees provided side by side in the horizontal direction (the sliding direction) above the mask plate, only one is selectively slid in abutment with the mask plate.

Paste is used in such a screen printing apparatus. When the paste is being scraped and rolled on the mask plate, the paste is low in viscosity and high in filling performance into the pattern openings of the mask plate. However, once the rolling of the paste is suspended, the viscosity becomes high and the filling performance into the pattern openings becomes low. Thus, printing accuracy deteriorates. In some screen printing apparatuses, therefore, a paste kneading operation is executed when a screen printing operation has been suspended continuously for a long time (e.g. for 30 minutes). In the paste kneading operation, a pair of squeegees are slid simultaneously within a predetermined area on the mask plate (normally an area on the mask plate in contact with clampers clamping the substrate) to roll the paste (e.g. JP-A-9-193343).

However, in the screen printing apparatus according to the background art, the two squeegees simultaneously move back and forth in abutment with the mask plate during the paste kneading operation. Accordingly, after scraping the paste within the kneading area, each of the squeegees moves while spreading the paste in an opposite direction to the direction in which the squeegee has scraped the paste till then. Therefore, there is a problem that printing failure may occur due to air mixed into the paste in a screen printing operation performed afterward or in a paste kneading operation performed successively.

SUMMARY

Therefore, an object of the invention is to provide a screen printing apparatus and a paste kneading method in which printing failure can be suppressed from occurring due to air mixed into paste.

The screen printing apparatus according to the invention is a screen printing apparatus including: a pair of clampers that clamp a substrate from sides of the substrate; a mask plate contacted to the substrate which is clamped by the pair of clampers; a pair of squeegees provided above the mask plate in a vertical direction and arranged in a horizontal direction; and a squeegee controller that selectively controls one of the pair of squeegees to move in the horizontal direction in abutment against the mask plate so that the selected one of the pair of squeegees slides on the mask plate, wherein when paste is kneaded in a kneading area on the mask plate, the squeegee controller performs a paste kneading operation in which only one squeegee of the pair of squeegees is abutted against the mask plate within the kneading area, the paste is to scraped within the kneading area by the one squeegee, and the one squeegee is lifted up, and then only the other squeegee of the pair of squeegees is abutted against the mask plate within the kneading area, the paste is scraped within the kneading area by the other squeegee, and the other squeegee is lifted up.

The paste kneading method according to the invention is a paste kneading method performed by a screen printing apparatus in order to knead paste within a kneading area on a mask plate, the screen printing apparatus including a pair of clampers that clamp a substrate from sides of the substrate, the mask plate contacted to the substrate which is clamped by the pair of clampers, and a pair of squeegees provided above the mask plate in a vertical direction and arranged in a horizontal direction, and one of which is selectively controlled to move in the horizontal direction in abutment against the mask plate so that the selected one of the pair of squeegees slides on the mask plate, the method comprising: a first step of bringing only one squeegee of the pair of squeegees into abutment against the mask plate within the kneading area; a second step of scrapping the paste within the kneading area by the one squeegee after the first step; a third step of lifting up the one squeegee after the second step; a fourth step of bringing only the other squeegee of the pair of squeegees into abutment against the mask plate within the kneading area after the third step; a fifth step of scrapping the paste within the kneading area by the other squeegee after the fourth step; and a sixth step of lifting up the other squeegee after the fifth step.

According to the invention, it is possible to suppress printing failure from occurring due to air mixed into paste.

DETAILED DESCRIPTION OF THE EXEMPLARY EMBODIMENTS

Figure 1:
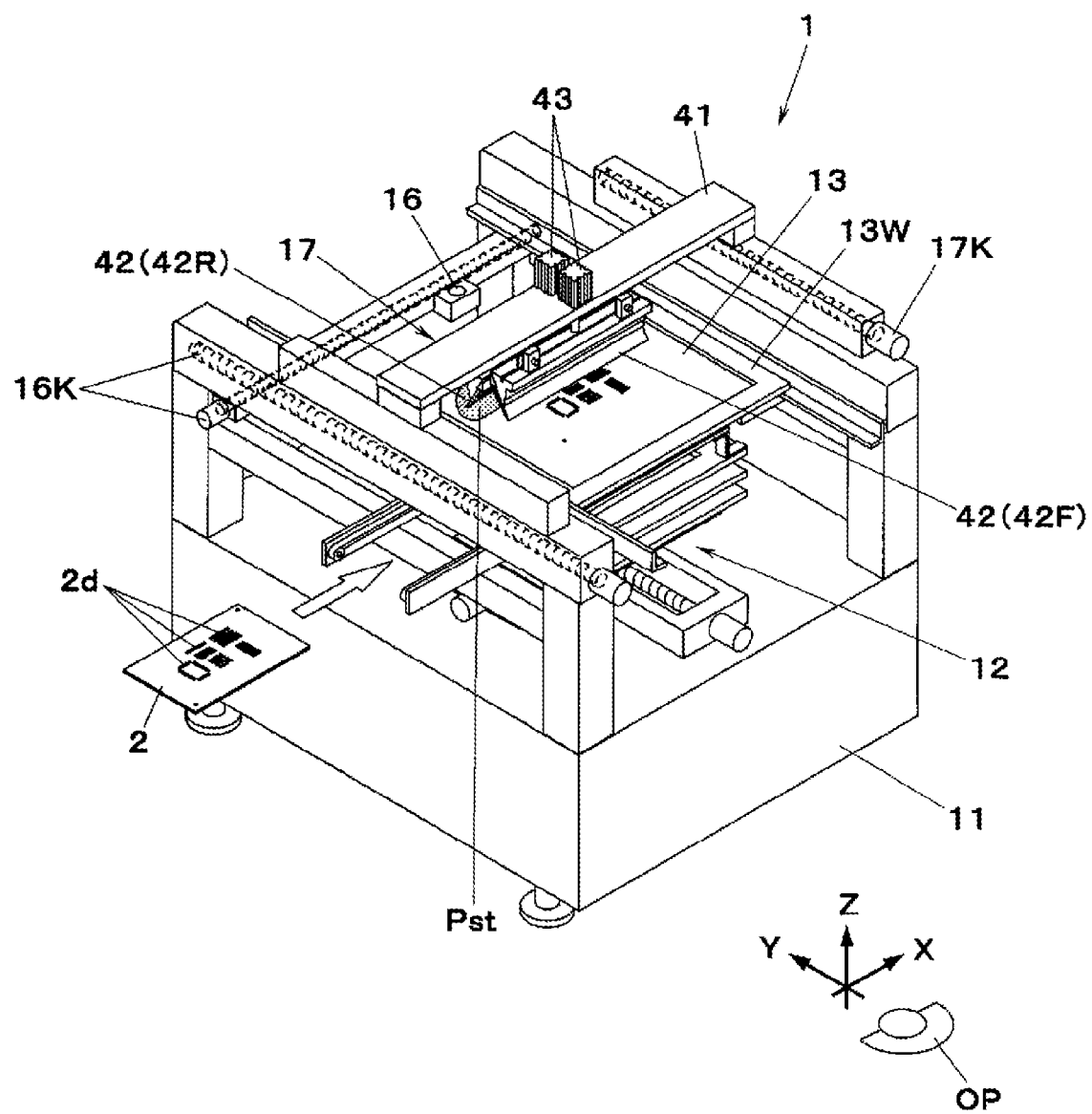
FIG. 1 is a perspective view of a screen printing apparatus in an embodiment of the invention.

An embodiment of the invention will be described below with reference to the drawings. FIG. 1 shows a screen printing apparatus 1 in the embodiment of the invention. The screen printing apparatus 1 repeatedly executes a screen printing operation to receive a substrate 2 imported from an upstream process side, screen-print paste Pst on each of electrodes 2d of the substrate 2, and pass the screen-printed substrate 2 to a downstream process side apparatus (e.g. a not-shown component mounting apparatus). In the embodiment, for convenience of explanation, a left/right direction seen from an operator OP will be designated by an X-axis direction; the left, an upstream process side; and the right, a downstream process side. In addition, a front/rear direction seen from the operator OP will be designated by a Y-axis direction; and an up/down direction, a Z-axis direction.

Figure 2:
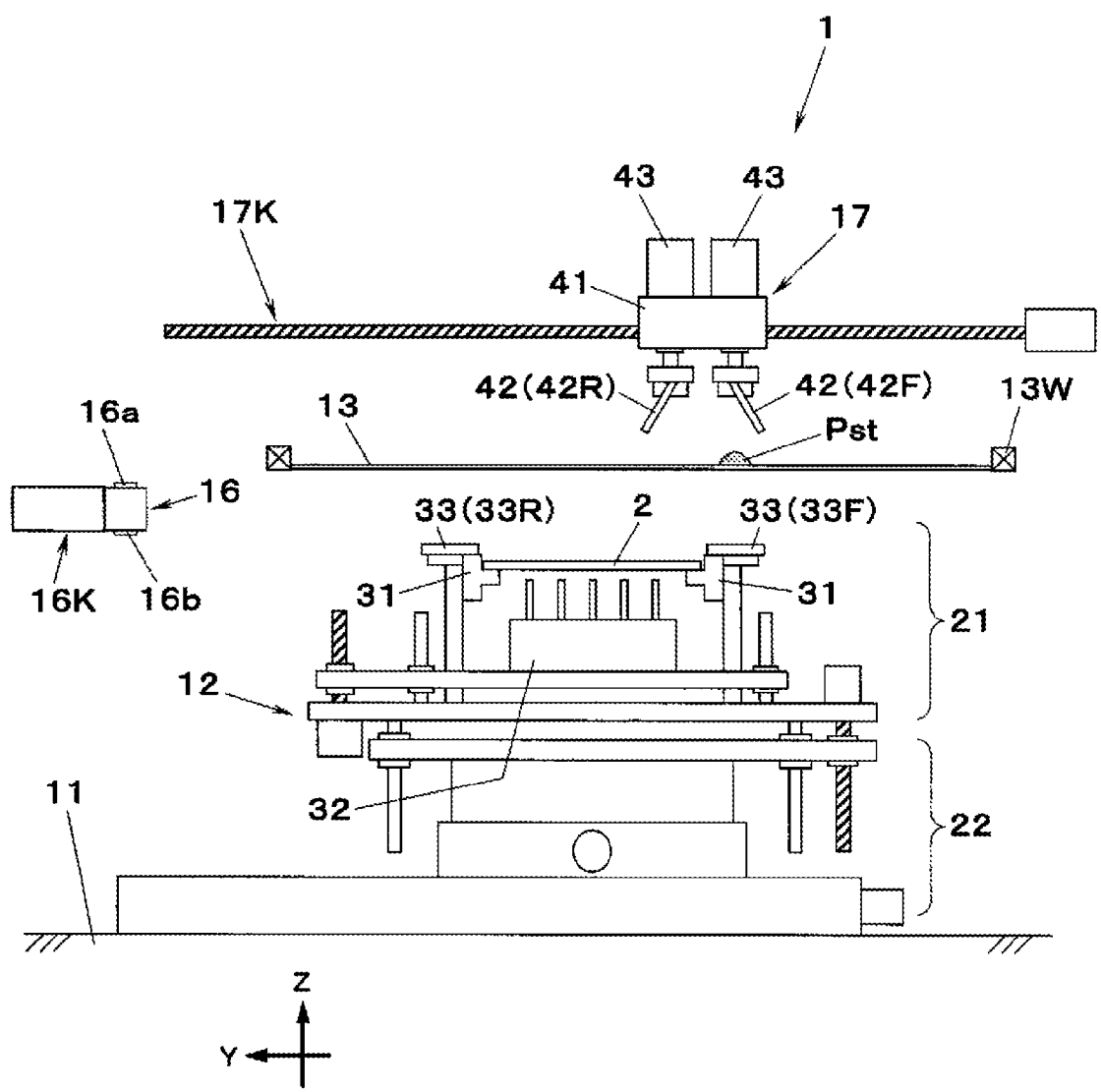
FIG. 2 is a side view of the screen printing apparatus in the embodiment of the invention.
Figure 3:
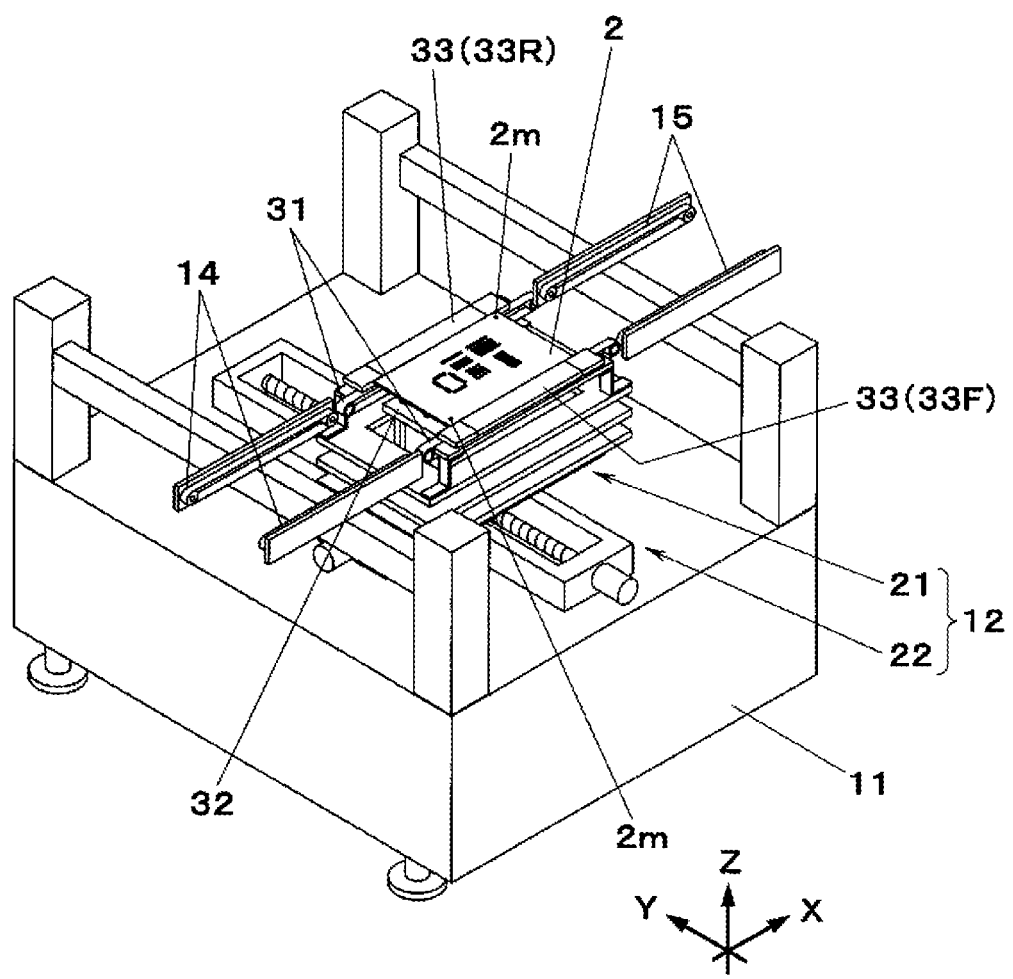
FIG. 3 is a partial perspective view of the screen printing apparatus in the embodiment of the invention.
Figure 4:
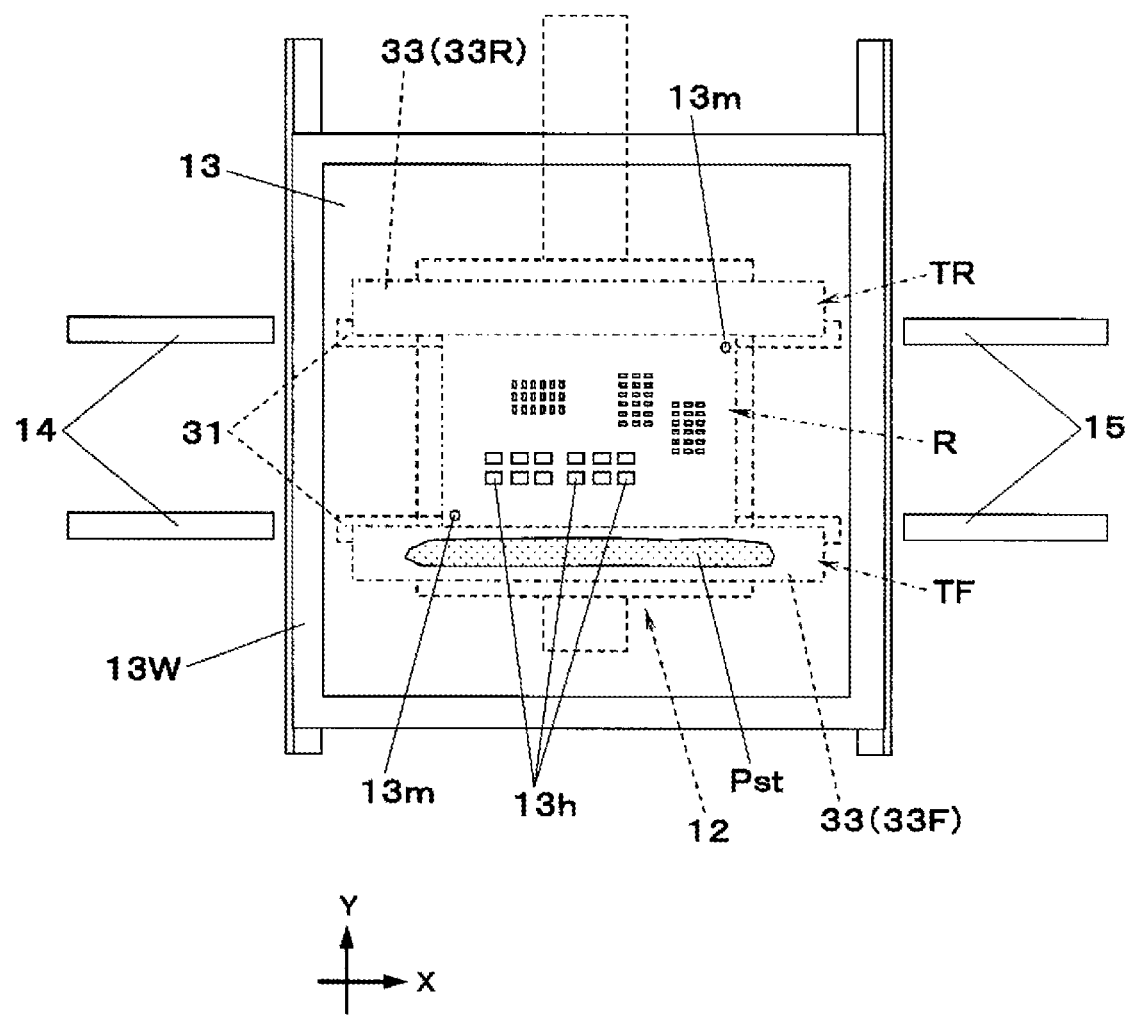
FIG. 4 is a partial plan view of the screen printing apparatus in the embodiment of the invention.

In FIG. 1 and FIG. 2, in the screen printing apparatus 1, a substrate holding and moving mechanism 12 is provided on a stand 11 and a mask plate 13 is provided above the substrate holding and moving mechanism 12. As shown in FIG. 3 and FIG. 4, a carry-in conveyor 14 which receives the substrate 2 imported from the upstream process side of the screen printing apparatus 1 and conveys the received substrate 2 to the substrate holding and moving mechanism 12 is provided on the left of the substrate holding and moving mechanism 12. A carry-out conveyor 15 which receives the substrate 2 from the substrate holding and moving mechanism 12 and conveys the received substrate 2 to the downstream process side is provided on the right of the substrate holding and moving mechanism 12. A camera 16 is provided movably in an area below the mask plate 13. A printing head 17 is provided movably in an area above the mask plate 13.

In FIG. 2 and FIG. 3, the substrate holding and moving mechanism 12 includes a substrate holding portion 21 and a moving table portion 22. The substrate holding portion 21 is provided with a positioning conveyor 31 (also see FIG. 4), an under receiving portion 32, and a pair of front and rear clampers 33 (also see FIG. 4). The positioning conveyor 31 positions the substrate 2 received from the carry-in conveyor 14 at a predetermined clamp position. The under receiving portion 32 supports, from below, the substrate 2 positioned at the clamp position by the positioning conveyor 31. The clampers 33 clamp and hold the substrate 2 from sides (in the Y-axis direction). Of the two clampers 33 belonging to the substrate holding portion 21, one located on a side of the operator OP is referred to as front clamp 33F and the other located on an opposite side to the operator OP is referred to as rear clamper 33R. The moving table portion 22 includes an XYθ table mechanism consisting of a plurality of table mechanisms which are stacked in multiple stages. The moving table portion 22 moves the substrate holding portion 21 in a direction within a horizontal plane and in the up/down direction.

In FIG. 1 and FIG. 2, the mask plate 13 includes a metal member shaped like a rectangular flat plate extending in an XY plane. In FIG. 4, a rectangular area in the center of the mask plate 13 serves as a substrate contact area R in which a lower surface of the mask plate 13 can come into contact with the substrate 2. In the substrate contact area R, pattern openings 13h are provided correspondingly to the arrangement of the electrodes 2d of the substrate 2. An outer circumference of the mask plate 13 is supported by a frame member 13W.

In FIG. 2, the camera 16 is provided with an upper imaging portion 16a whose imaging visual field faces up and a lower imaging portion 16b whose imaging visual field faces down. The camera 16 is driven by a camera moving mechanism 16K (also see FIG. 1) using a ball screw mechanism as an actuator, so that the camera 16 can move within the XY plane.

In FIG. 1 and FIG. 2, the printing head 17 includes a moving base 41, two squeegees 42, and two squeegee lifting cylinders 43. The moving base 41 is a member extending in the X-axis direction. The moving base 41 is driven by a printing head moving mechanism 17K using a ball screw mechanism as an actuator so that the moving base 41 can move in the Y-axis direction. The two squeegees 42 are arranged side by side and oppositely to each other in the front/rear direction on the moving base 41. The two squeegees 42 move integrally back and forth in the Y-axis direction due to the movement of the moving base 41 in the Y-axis direction. Of the two front and rear squeegees 42, one located in the front (on a right side of the paper of FIG. 2) will be referred to as front squeegee 42F and the other located at the rear (on a left side of the paper of FIG. 2) will be referred to as rear squeegee 42R. Each of the two squeegees 42 includes a "spatula"-like member extending in the X-axis direction. The two squeegees 42 extend obliquely downward to expand an interval from each other as they go downward. A rear side face of the front squeegee 42F is a paste scraping face and a front side face of the rear squeegee 42R is a paste scraping face.

The two squeegee lifting cylinders 43 are provided on the moving base 41, side by side in the front/rear direction and correspondingly to the two squeegees 42. The two squeegee lifting cylinders 43 operate separately and lift up/down the two squeegees 42 independently and relatively to the moving base 41. Each of the squeegee lifting cylinders 43 can lift up/down the corresponding squeegee 42 between a standby height position (see the squeegee 42 on the right side of the paper shown in FIG. 2) at which a lower end of the squeegee 42 is separated from an upper surface of the mask plate 13 by a predetermined distance, and an abutment height position at which the lower end of the squeegee 42 abuts against the mask plate 13.

A control device 60 (FIG. 5) belonging to the screen printing apparatus 1 performs control over the carry-in conveyor 14 for a conveyance operation of the substrate 2, control over the substrate holding and moving mechanism 12 for a holding and moving operation of the substrate 2, and control over the carry-out conveyor 15 for a conveyance operation of the substrate 2. In addition, the control device 60 also performs control over the camera moving mechanism 16K for a movement operation of the camera 16 and an imaging operation of the camera 16, control over the printing head moving mechanism 17K for a movement operation of the printing head 17, and control over the squeegee lifting cylinders 43 for lifting up/down operations of the respective squeegees 42. Image data obtained by each image taken by the camera 16 are sent to the control device 60 and image recognition is performed in an image processor 60a (FIG. 5) of the control device 60.

Figure 6A:
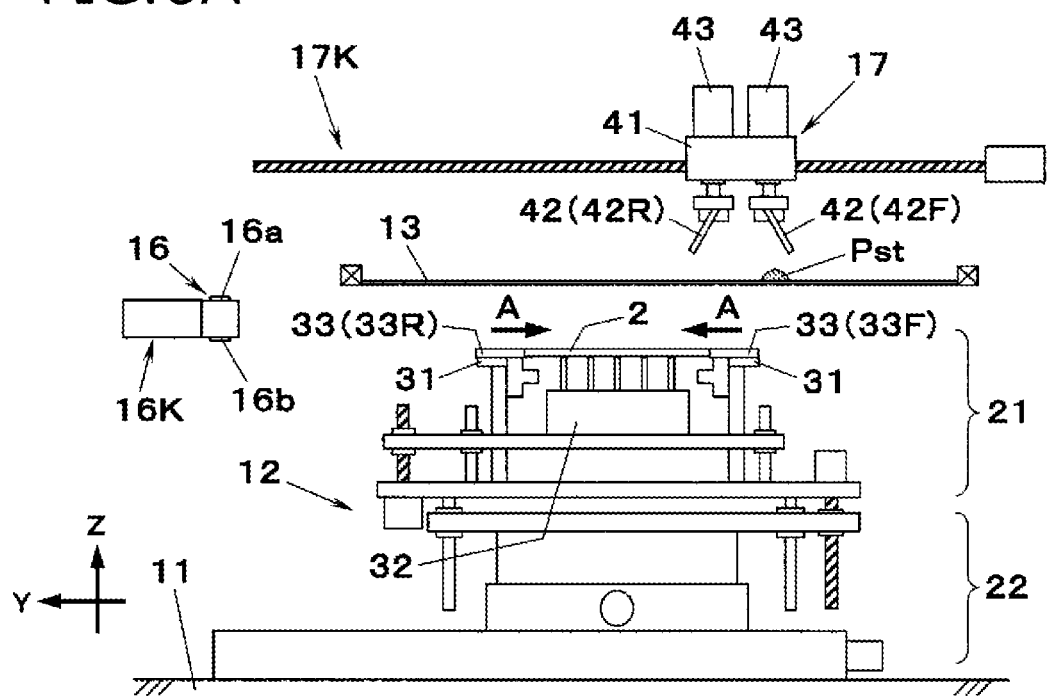
FIGS. 6A and 6B are views for explaining a screen printing operation performed by the screen printing apparatus in the embodiment of the invention.
Figure 6B:
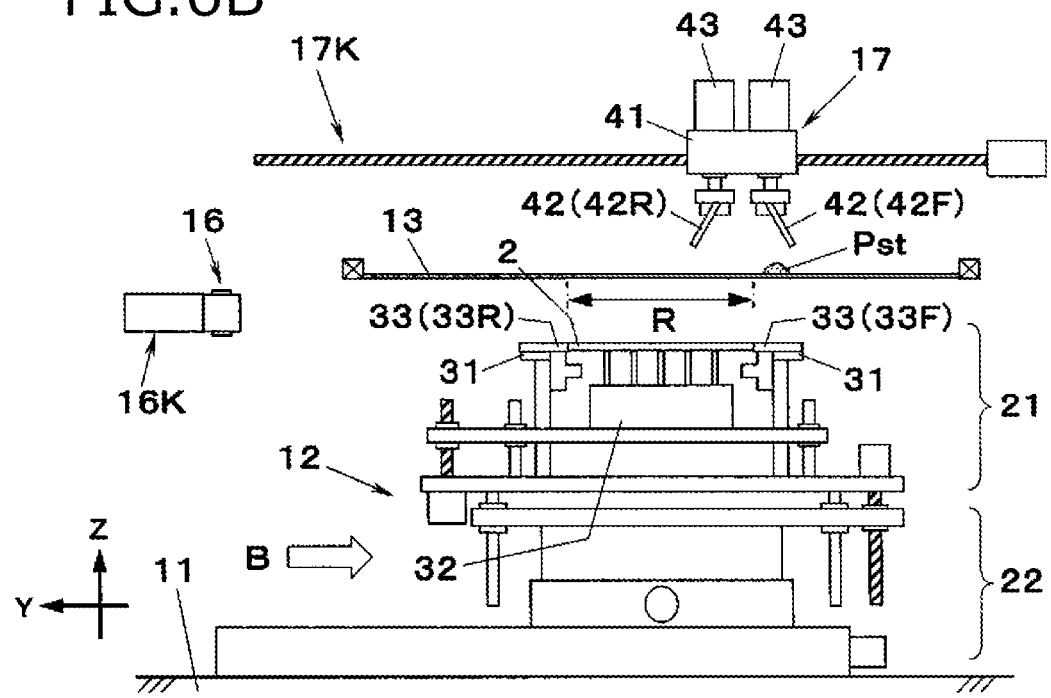

Next, an operation of the screen printing apparatus 1 having the aforementioned configuration will be described. When a substrate 2 is imported from the upstream process side, the carry-in conveyor 14 receives the substrate 2 and passes the received substrate 2 to the substrate holding portion 21. In the substrate holding portion 21, the substrate 2 received from the carry-in conveyor 14 is positioned at the predetermined clamp position by the positioning conveyor 31, supported from below by the under receiving portion 32, and then clamped by the clampers 33 (FIG. 6A, arrows A shown in FIG. 6A). When the substrate holding portion 21 holds the substrate 2, the moving table portion 22 moves the substrate holding portion 21 and positions the substrate 2 below the substrate contact area R of the mask plate 13 (FIG. 6B, an arrow B shown in FIG. 6B).

Figure 7A:
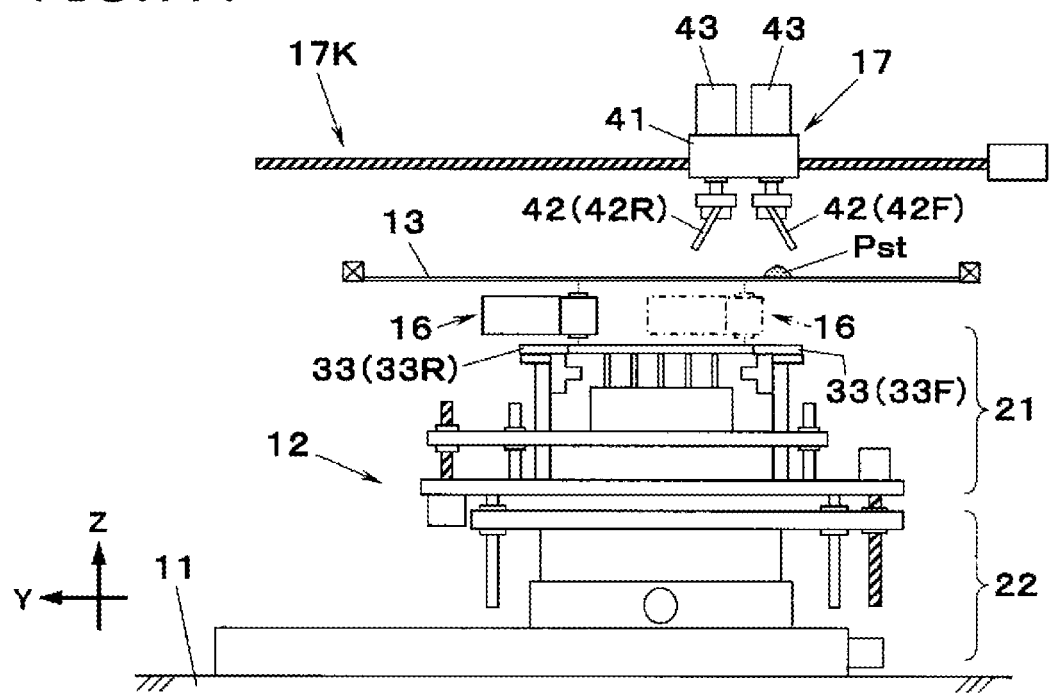
FIGS. 7A and 7B are views for explaining the screen printing operation performed by the screen printing apparatus in the embodiment of the invention.
Figure 7B:
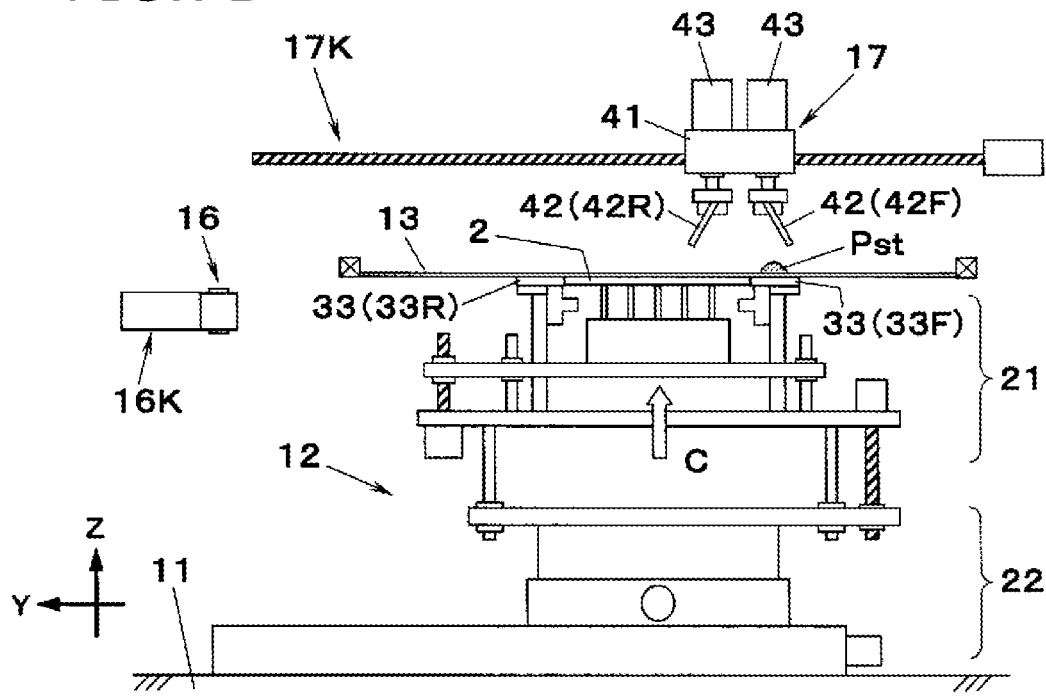

After the substrate 2 is positioned below the substrate contact area R, the camera 16 moves so that the camera 16 can use the upper imaging portion 16a to image mask side marks 13m (FIG. 4) provided within the substrate contact area R from below and use the lower imaging portion 16b to image substrate side marks 2m (FIG. 3) of the substrate 2 held by the substrate holding portion 21 from above (FIG. 7A). When the images taken by the camera 16 are completed, the substrate holding and moving mechanism 12 moves the substrate 2 so as to align the mask side marks 13m and the substrate side marks 2m with each other respectively in plan view. Then, the substrate holding and moving mechanism 12 lifts up the substrate 2 to bring the substrate 2 into contact with the substrate contact area R (FIG. 7B, an arrow C shown in FIG. 7B). Thus, the electrodes 2d are aligned with the corresponding pattern openings 13h to be exposed on an upper surface side of the mask plate 13.

When the substrate 2 is in contact with the substrate contact area R as described above, the front clamper 33F comes into contact with the lower surface of the mask plate 13 in an area in front of the substrate contact area R and the rear clamper 33R comes into contact with the lower surface of the mask plate 13 in an area at the rear of the substrate contact area R. In the embodiment, an upper surface area of the front clamper 33F in contact with the mask plate 13 will be referred to as front standby area TF and an upper surface area of the rear clamper 33R in contact with the mask plate 13 will be referred to as rear standby area TR (FIG. 4). The front standby area TF and the rear standby area TR serve as areas where the paste Pst can be made on standby before a printing operation starts. In the embodiment, the paste Pst is supplied to the front standby area TF in the beginning (FIG. 4).

Figure 5:
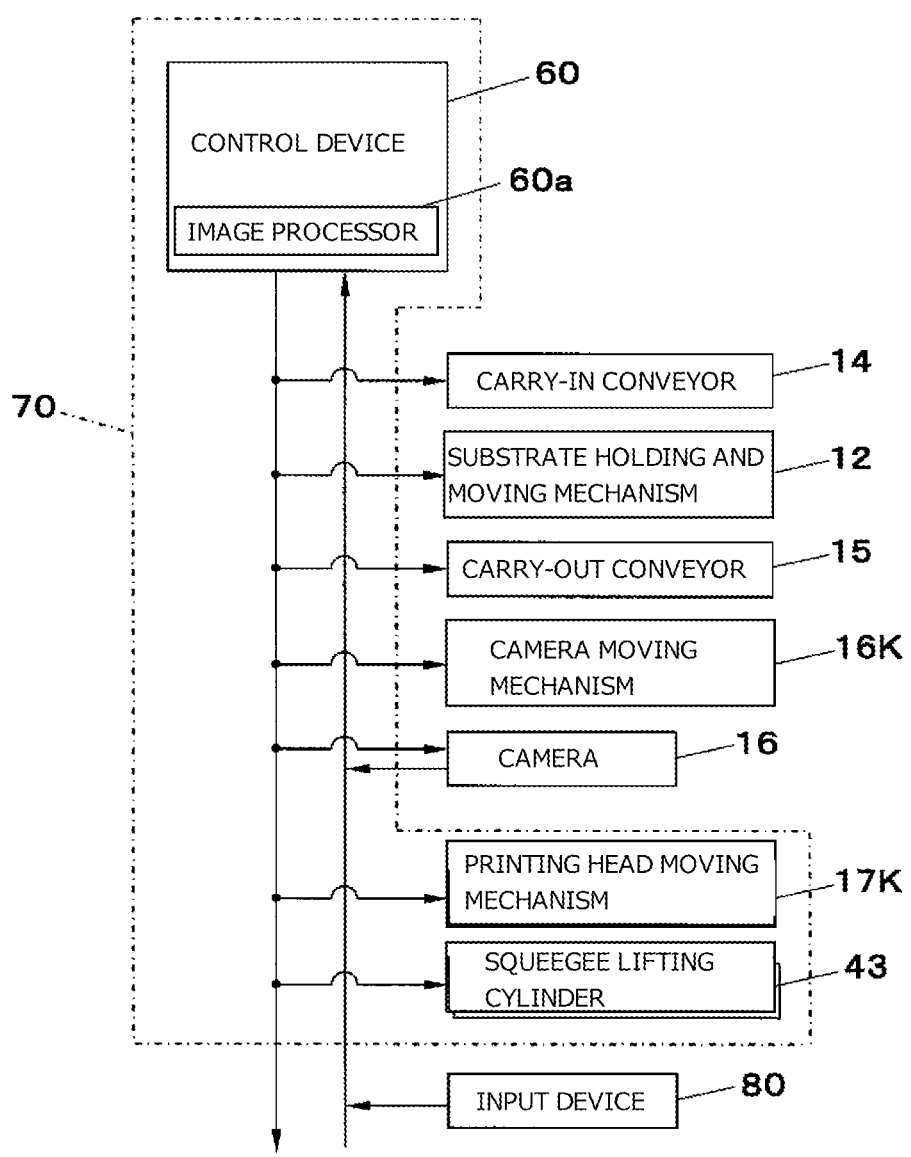
FIG. 5 is a block diagram showing a control system of the screen printing apparatus in the embodiment of the invention.

Next, the procedure of the screen printing operation performed by the screen printing apparatus 1 will be described. Here, the squeegee lifting cylinders 43, the printing head moving mechanism 17K and the control device 60 will be generically referred to as squeegee controller 70 (FIG. 5).

Figure 8A:
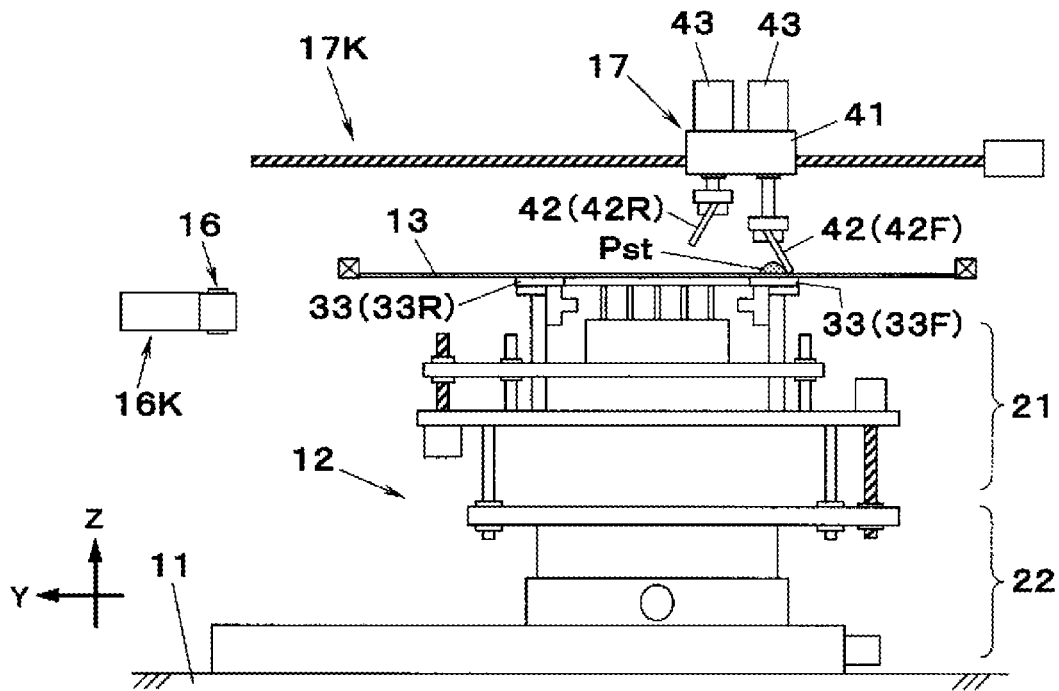
FIGS. 8A and 8B are views for explaining the screen printing operation performed by the screen printing apparatus in the embodiment of the invention.
Figure 8B:
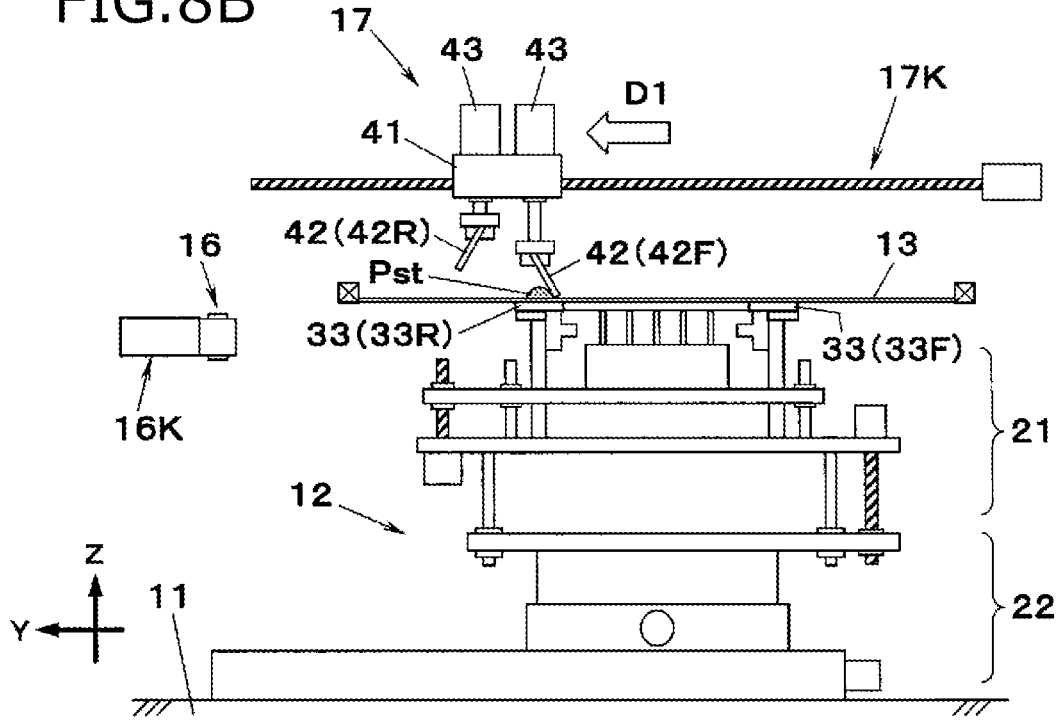

When the paste Pst on the mask plate 13 has to be scraped by the front squeegee 42F to fill the pattern openings 13h of the mask plate 13 with the paste Pst, the squeegee controller 70 first lifts down, of the two squeegees 42 located at the standby height position, only the front squeegee 42F to the abutment height position to make the lower end of the front squeegee 42F abut against the front standby area TF. On this occasion, the squeegee controller 70 moves the moving base 41 in the Y-axis direction to bring the paste scraping face of the front squeegee 42F into contact with a front end of the paste Pst (FIG. 8A). The squeegee controller 70 moves the moving base 41 rearward to slide the front squeegee 42F on the mask plate 13 to thereby scrape the paste Pst rearward (an arrow D1 shown in FIG. 8B). After the paste Pst has passed through the pattern openings 13h and moved to the rear standby area TR in this manner (FIG. 8B), the squeegee controller 70 lifts up the front squeegee 42F to restore the front squeegee 42F to the standby height position.

Figure 9A:
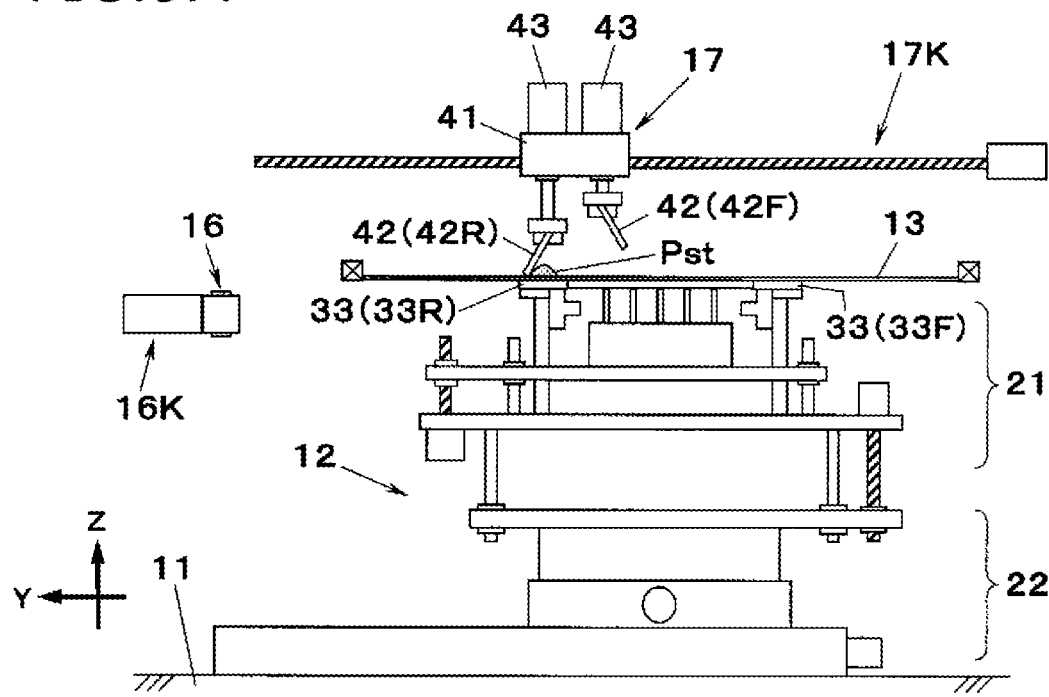
FIGS. 9A and 9B are views for explaining the screen printing operation performed by the screen printing apparatus in the embodiment of the invention.
Figure 9B:
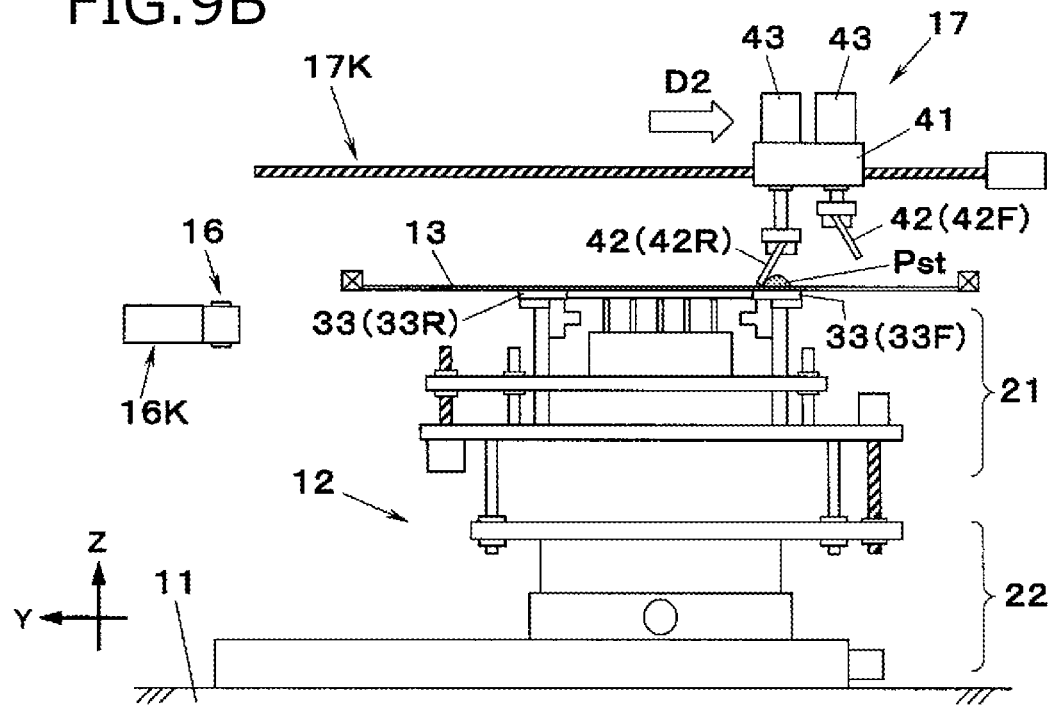

On the other hand, when the paste Pst on the mask plate 13 has to be scraped by the rear squeegee 42R to fill the pattern openings 13h of the mask plate 13 with the paste Pst, the squeegee controller 70 first lifts down, of the two squeegees 42 located at the standby height position, only the rear squeegee 42R to the abutment height position to make the lower end of the rear squeegee 42R abut against the rear standby area TR. On this occasion, the squeegee controller 70 moves the moving base 41 in the Y-axis direction to bring the paste scraping face of the rear squeegee 42R into contact with a rear end of the paste Pst (FIG. 9A). The squeegee controller 70 moves the moving base 41 frontward to slide the rear squeegee 42R on the mask plate 13 to thereby scrape the paste Pst frontward (an arrow D2 shown in FIG. 9B). After the paste Pst has passed through the pattern openings 13h and moved to the front standby area TF in this manner (FIG. 9B), the squeegee controller 70 lifts up the rear squeegee 42R to restore the rear squeegee 42R to the standby height position.

The paste Pst scraped by the paste scraping face of one of the squeegees 42 rolls on the mask plate 13. When the rolling paste Pst passes through the pattern openings 13h, the pattern openings 13h are filled with the paste Pst. When filling the pattern openings 13h with the paste Pst by the front squeegee 42F or filling the pattern openings 13h with the paste Pst by the rear squeegee 42R is completed, the substrate holding and moving mechanism 12 lifts down the substrate holding portion 21 to separate the substrate 2. Thus, a layer of the paste Pst with a thickness corresponding to the thickness of the mask plate 13 is formed on the respective electrodes 2d of the substrate 2, and screen printing is completed.

After the paste Pst is printed on the respective electrodes 2d on the substrate 2 and the screen printing per substrate 2 is completed as described above, the substrate holding and moving mechanism 12 opens the clampers 33 to release the holding of the substrate 2. The positioning conveyor 31 is operated to pass the substrate 2 to the carry-out conveyor 15. The carry-out conveyor 15 carries the received substrate 2 out to the downstream process side.

As described above, whenever a substrate 2 is imported into the screen printing apparatus 1, the screen printing apparatus 1 repeatedly executes a screen printing operation on the substrate 2 with the paste Pst. However, under predetermined conditions (which will be described later), the squeegee controller 70 executes a paste kneading operation to knead the paste Pst so as to prevent the paste Pst from being solidified. In the paste kneading operation, the paste Pst is rolled and kneaded by the pair of squeegees 42 alternately in opposite directions in a kneading area which is set at a predetermined area on the mask plate 13. The kneading area is an area where the mask plate 13 brought into contact with the substrate 2 is normally in contact with one of the pair of front and rear clampers 33. In the embodiment, assume that the kneading area is set at the front standby area TF.

Figure 10A:
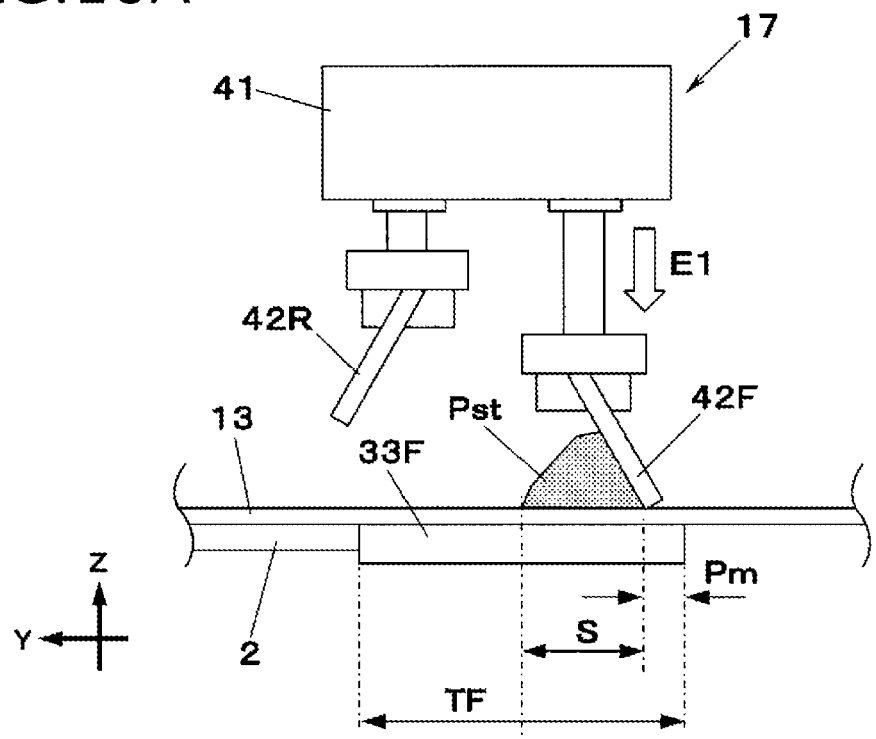
FIGS. 10A and 10B are views for explaining a paste kneading operation performed by the screen printing apparatus in the embodiment of the invention.
Figure 10B:
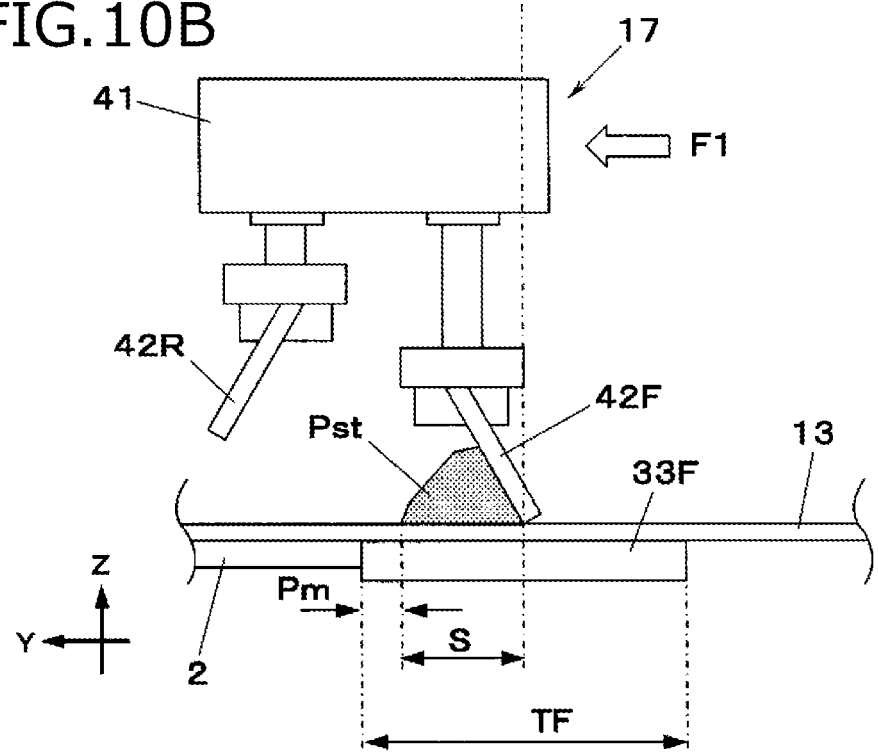

When the paste kneading operation is performed in the front standby area TF set as the kneading area in the screen printing apparatus 1, the squeegee controller 70 first lifts down only the front squeegee 42F (one of the pair of squeegees 42) from the standby height position to the abutment height position to bring the front squeegee 42F into abutment within the kneading area (front standby area TF) (an arrow E1 indicated in FIG. 10A, a first step). The squeegee controller 70 slides the front squeegee 42F on the mask plate 13 to thereby scrape the paste Pst within the kneading area (an arrow F1 indicated in FIG. 10B, a second step). After the paste Pst has rolled a predetermined distance (a minimum rolling distance S required for kneading the paste Pst, i.e. a Y-axis direction dimension of a contact area of the paste Pst with the mask plate 13 in this case) (FIG. 10B), the squeegee controller 70 lifts up the front squeegee 42F (an arrow E2 indicated in FIG. 11A, a third step).

The reason why the front squeegee 42F is lifted up in the third step is that the paste Pst can be prevented from being spread in an opposite direction (frontward) to the scraping direction of the front squeegee 42F when the front squeegee 42F is separated from the paste Pst. Thus, air can be prevented from being mixed into the paste Pst in a screen printing operation performed afterward or in a paste kneading operation performed successively. The lifting up direction of the front squeegee 42F may be right upward. However, the front squeegee 42F may be lifted up in a direction (obliquely rearward and upward) nearly in parallel with the paste scraping face of the front squeegee 42F.

Figure 11A:
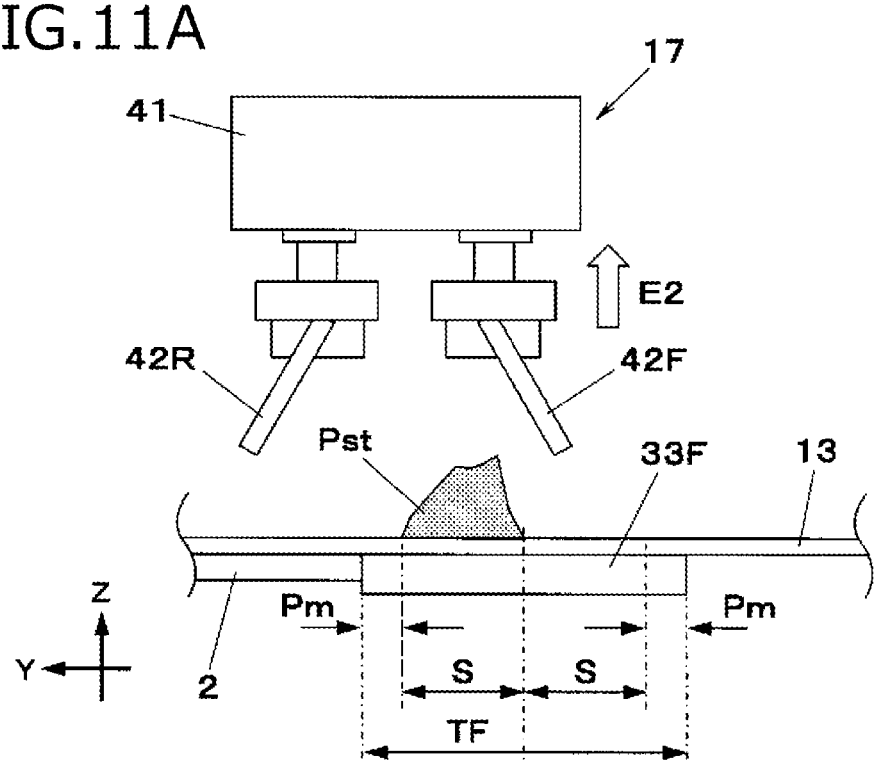
FIGS. 11A and 11B are views for explaining the paste kneading operation performed by the screen printing apparatus in the embodiment of the invention.
Figure 11B:
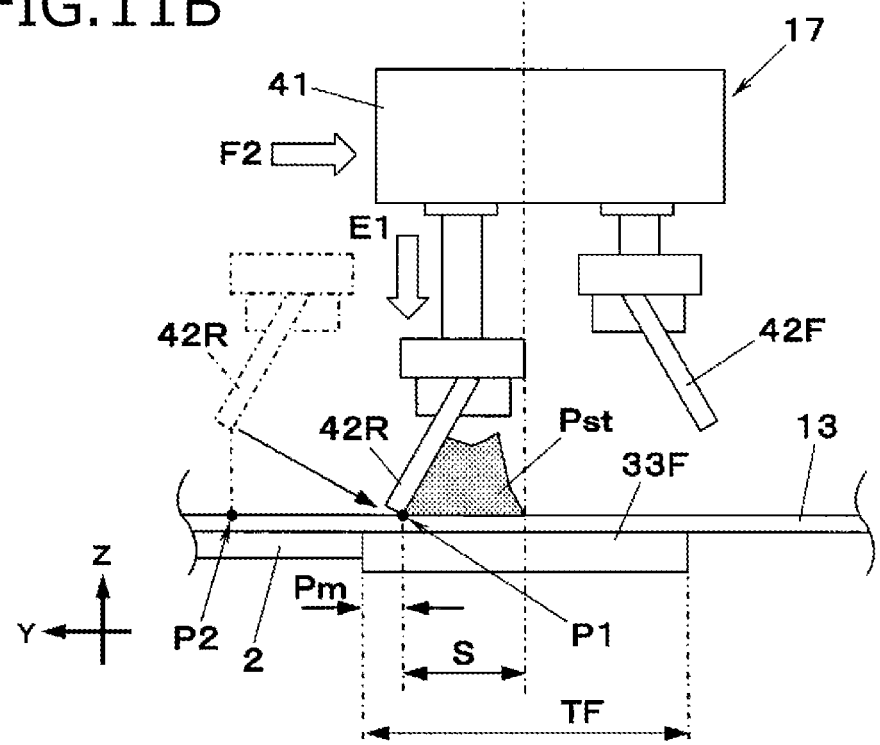

After the third step, only the rear squeegee 42R (the other of the pair of squeegees 42) is lifted down from the standby height position to the abutment height position so as to be brought into abutment within the kneading area (front standby area TF) (an arrow E1 indicated in FIG. 11B, a fourth step). On this occasion, an abutment point P1 (FIG. 11B) when the rear squeegee 42R is brought into abutment within the kneading area is set at a position closer to the side of the front squeegee 42F (front) than a point P2 (FIG. 11B) which is immediately under the lower end of the rear squeegee 42R at a time instant when scraping the paste Pst within the kneading area by the front squeegee 42F has been completed. Therefore, the squeegee controller 70 moves the moving base 41 frontward (an arrow F2 indicated in FIG. 11B) in sync with the lifting down of the rear squeegee 42R. Alternatively, the rear squeegee 42R may be lifted down from the standby height position to the abutment height position after the moving base 41 is moved frontward.

Figure 12A:
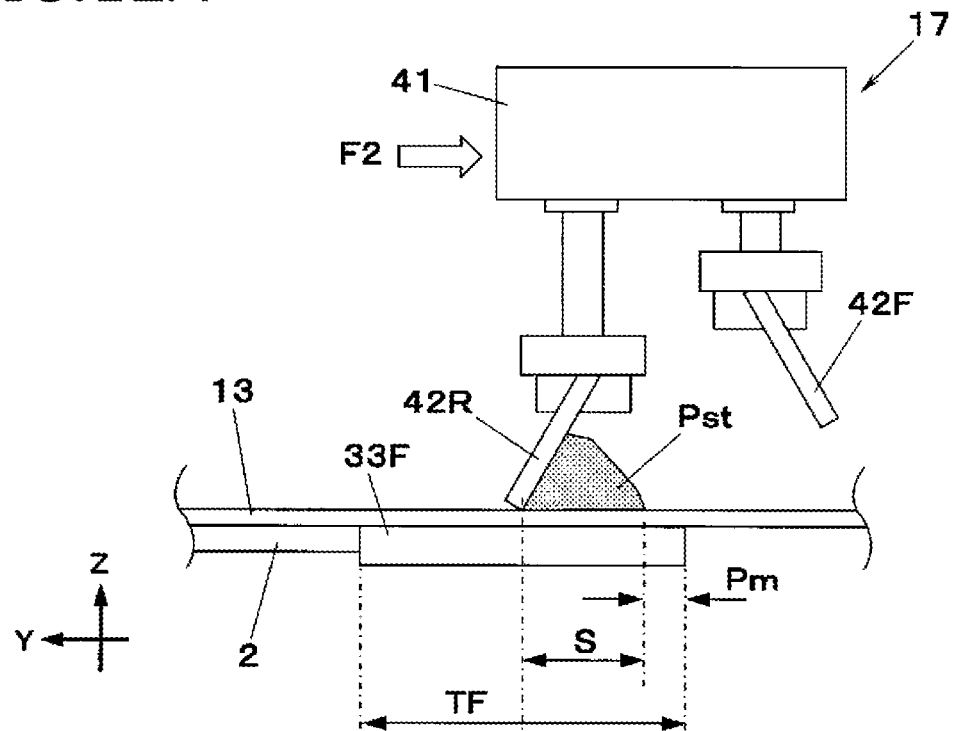
FIGS. 12A and 12B are views for explaining the paste kneading operation performed by the screen printing apparatus in the embodiment of the invention.
Figure 12B:
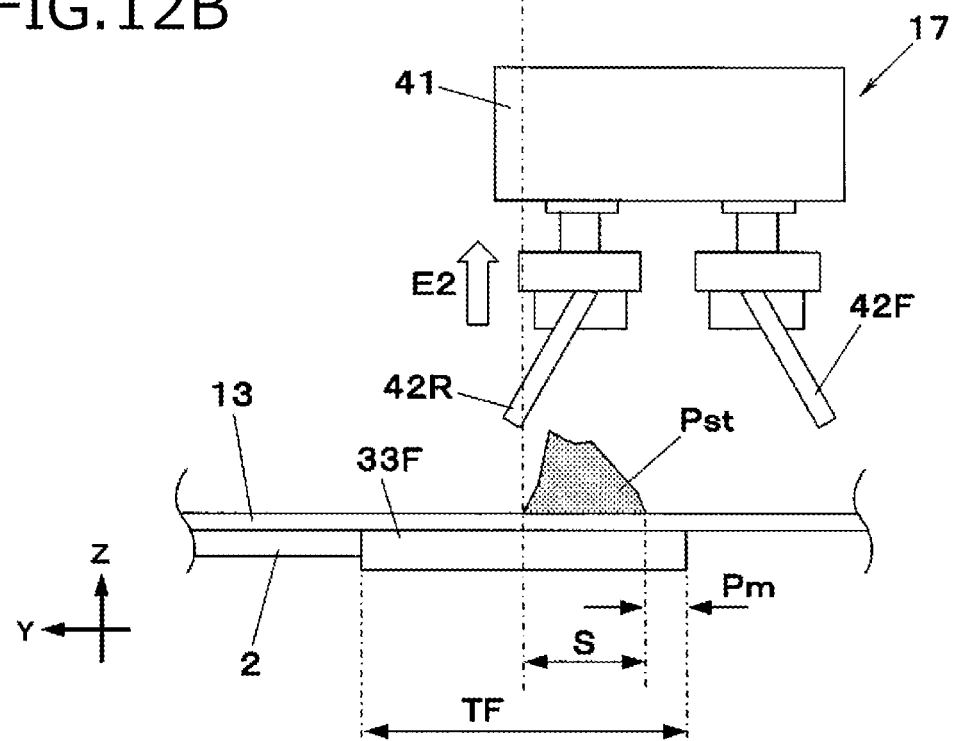

After the rear squeegee 42R is brought into abutment against the kneading area in the fourth step, the rear squeegee 42R is slid on the mask plate 13 to scrape the paste Pst within the kneading area (an arrow F2 indicated in FIG. 12A, a fifth step). After the paste Pst rolls a rolling distance S (FIG. 12A), the rear squeegee 42R is lifted up (an arrow E2 indicated in FIG. 12B, a sixth step).

The reason why the rear squeegee 42R is lifted up in the sixth step is that the paste Pst can be prevented from being spread in an opposite direction (rearward) to the scraping direction of the rear squeegee 42R when the rear squeegee 42R is separated from the paste Pst. Thus, air can be prevented from being mixed into the paste Pst in a screen printing operation performed afterward or in a paste kneading operation performed successively. The lifting up direction of the rear squeegee 42R may be right upward. However, the rear squeegee 42R may be lifted up in a direction (obliquely frontward and upward) nearly in parallel with the paste scraping face of the rear squeegee 42R.

The paste Pst is rolled back and forth once to be kneaded in the kneading area by the aforementioned paste kneading operation so that the viscosity of the paste Pst can be reduced. Therefore, printing failure can be prevented from occurring due to screen printing performed in a state in which the paste Pst is solidified.

In the aforementioned paste kneading operation, the squeegee 42 which does not engage in scraping the paste Pst can be prevented from sliding on the mask plate 13 and the distance with which the squeegee 42 engaging in scraping the paste Pst slides on the mask plate 13 can be minimized. Thus, a width-direction dimension (a dimension in the scraping direction of the paste Pst, i.e. in the Y-axis direction) of the kneading area required for kneading the paste Pst can be set to be about twice as long as a distance obtained by adding a certain margin (Pm. See FIGS. 10A, 10B, 11A, 11B, 12A and 12B) to the minimum rolling distance S required for kneading the paste Pst (FIG. 11A).

In addition, in the aforementioned paste kneading operation, the squeegee 42 which has completed scraping the paste Pst within the kneading area is lifted up. Thus, the squeegee 42 which has completed scraping the paste Pst within the kneading area does not spread the paste Pst in an opposite direction to the scraping direction so that air can be prevented from being mixed into the paste Pst in a screen printing operation performed afterward or in a paste kneading operation performed successively.

Figure 13A:
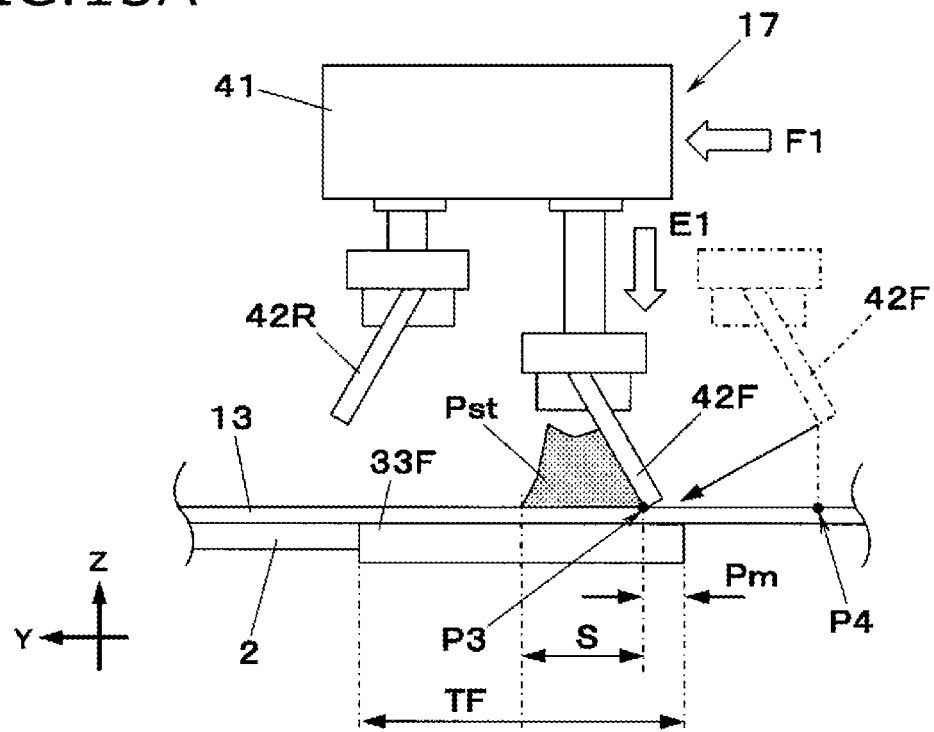
FIGS. 13A and 13B are views for explaining the paste kneading operation performed by the screen printing apparatus in the embodiment of the invention.
Figure 13B:
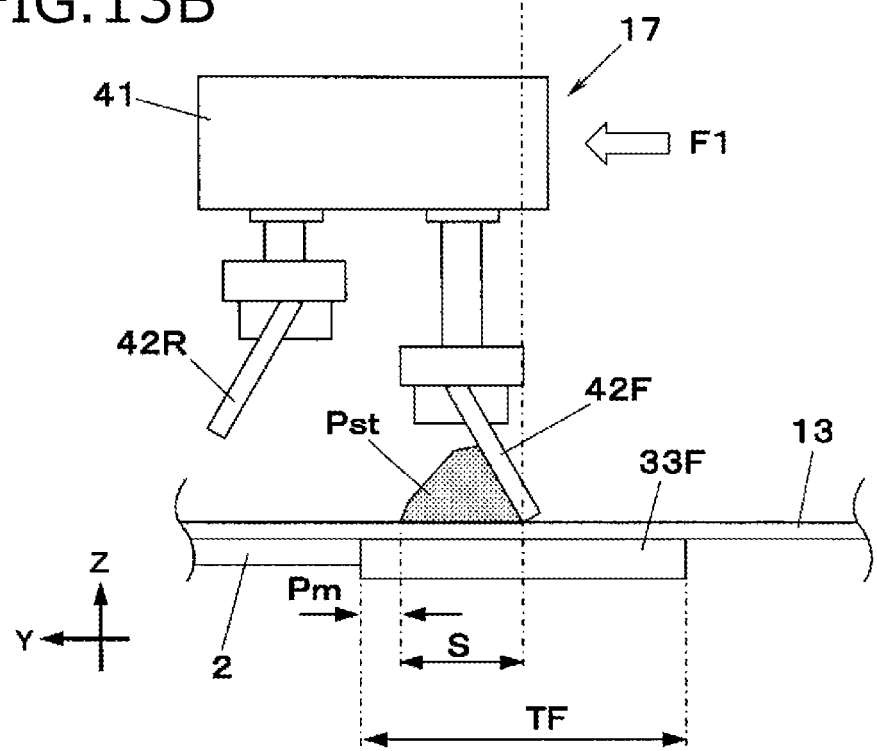

When configuration is made to execute the kneading operation in the aforementioned procedure a number of times repeatedly (FIG. 13A→FIG. 13B), the accumulated rolling distance of the paste Pst within the kneading area increases preferably in the respect of reduction of the viscosity of the paste Pst. In this case, a first step is executed after the sixth step. On this occasion, an abutment point P3 (FIG. 13A) where the front squeegee 42F (one squeegee 42) is brought into abutment within the kneading area is set at a position closer to the side of the rear squeegee 42R than a point P4 (FIG. 13A) which is immediately under the lower end of the front squeegee 42F at a time instant when scraping the paste Pst within the kneading area by the rear squeegee 42R (the other squeegee 42) has been completed. Therefore, the squeegee controller 70 moves the moving base 41 rearward (an arrow F1 indicated in FIG. 13A) in sync with the lifting down of the front squeegee 42F (an arrow E1 indicated in FIG. 13A). Alternatively, the front squeegee 42F may be lifted down from the standby height position to the abutment height position after the moving base 41 is moved rearward.

It is preferable that required input can be made through an input device 80 (FIG. 5) connected to the control device 60 in the screen printing apparatus 1 in the embodiment so as to set the abutment points (the aforementioned abutment points P1 and P3) of the pair of front and rear squeegees 42 within the kneading area to the squeegee controller 70 desirably. In this manner, a sliding range of each squeegee 42 during the paste kneading operation can be set at a required minimum range in accordance with the width-direction (Y-direction) dimension of the paste Pst to be kneaded.

In addition, it is preferable that required input can be made through the input device 80 in the screen printing apparatus 1 in the embodiment so as to set the number of times of repetition of the paste kneading operation or the repetition time of the paste kneading operation to the squeegee controller 70 when the paste kneading operation is executed a number of times continuously. In this manner, it is possible to knead the paste Pst necessarily and sufficiently.

In addition, it is preferable that required input can be made through the input device 80 in the screen printing apparatus 1 in the embodiment so as to set the sliding speed of each squeegee 42 on the mask plate 13 in the paste kneading operation and printing pressure of the squeegee 42 against the mask plate 13 desirably to the squeegee controller 70 respectively. In this manner, it is possible to knead the paste Pst suitably in accordance with the material etc. of the paste Pst.

In addition, it is preferable that required input can be made through the input device 80 in the screen printing apparatus 1 in the embodiment so as to set the timing to the squeegee controller 70 for executing the paste kneading operation. For example, the timing may be selected from the following four modes. That is, (1) the paste kneading operation is always executed automatically before a screen printing operation is executed on one substrate 2, (2) the paste kneading operation is executed automatically after a reference time set in advance has elapsed after a screen printing operation has been performed but before a next screen printing operation is performed, (3) when a work is interrupted for some reason (for example, a work trouble has occurred in another apparatus disposed in front of or at the rear of the screen printing apparatus 1), the paste kneading operation is executed automatically at the beginning of a screen printing operation which is resumed on one of the remaining substrates 2 or at the beginning of the work on that day, and (4) the aforementioned (1) and (2) are used together.

In the aforementioned mode (1), the paste Pst is kneaded whenever one substrate 2 is carried in. The mode (1) has an advantage that the viscosity of the paste Pst can be always kept low although a substantial screen printing time required for each substrate 2 becomes long. In the modes (2) to (4), the paste Pst is kneaded when an interval time between one screen printing operation and a next screen printing operation becomes long. The modes (2) to (4) have an advantage that extreme reduction in viscosity of the paste can be prevented without needing such a long time as in the mode (1).

As described above, according to the screen printing apparatus 1 and the paste kneading method performed by the screen printing apparatus 1 in the embodiment, one squeegee 42 which has completed scraping the paste Pst within the kneading area is lifted up in scraping and kneading the paste Pst by means of the two squeegees alternately. Therefore, the squeegee 42 which has completed scraping the paste Pst within the kneading area does not spread the paste Pst in an opposite direction to the scraping direction so that air can be prevented from being mixed into the paste Pst in a screen printing operation performed afterward or in a paste kneading operation performed successively. Therefore, printing failure can be prevented from occurring due to air mixed into the paste Pst.

(Replenished Description Corresponding to Paragraphs and of 2015-003849)

In addition, according to the screen printing apparatus 1 and the paste kneading method performed by the screen printing apparatus 1 in the embodiment, a point (abutment point) where the other squeegee 42 is brought into abutment within the kneading area after one squeegee 42 has completed scraping the paste Pst may be set at a position closer to the side of the one squeegee 42 than a point which is immediately under the lower end of the other squeegee 42 at a time instant when the one squeegee 42 has completed scraping the paste Pst. According to the screen printing apparatus according to the background art, a distance (specifically, a distance twice as long as the distance between the lower ends of the two squeegees) largely exceeding the minimum rolling distance required for kneading the paste is required as the dimension (the dimension in the paste scraping direction) of the kneading area in order to prevent both the two squeegees from deviating from the kneading area. Thus, there has been a problem that the size of each clamper may be increased. According to the aforementioned configuration of the embodiment, the width-direction dimension (the dimension in the scraping direction of the paste Pst) of the kneading area required for kneading the paste Pst may be about twice as long as a distance obtained by adding the certain margin Pm to the minimum rolling distance S required for kneading the paste Pst. The size of each clamper 33 can be reduced. Hence, the size of the screen printing apparatus 1 as a whole can be made compact.

Incidentally, although the procedure of the paste kneading operation in the kneading area which is set at the front standby area TF has been described in the aforementioned embodiment, the paste kneading operation in the kneading area which is set at the rear standby area TR may be performed. Since the kneading area is set at the front standby area TF in the aforementioned description, one squeegee 42" is the front squeegee 42F and the other squeegee 42" is the rear squeegee 42R. However, when the paste kneading area is set at the rear standby area TR, one squeegee 42" is the rear squeegee 42R and the other squeegee 42" is the front squeegee 42F. Further, the paste kneading area is not limited to the area where the mask plate 13 brought into contact with the substrate 2 is in contact with one of the pair of clampers 33. However, the paste Pst may be kneaded in a kneading area which is set at an area out of the area where the mask plate 13 is in contact with one of the clamps 33.

It is possible to provide a screen printing apparatus and a paste kneading method in which printing failure can be prevented from occurring due to air mixed into paste.

What is claimed is:

1. A paste kneading method performed by a screen printing apparatus in order to knead paste on a mask plate, the screen printing apparatus including a pair of clampers that clamp a substrate from sides of the substrate, the mask plate contacted to the substrate which is clamped by the pair of clampers, and a pair of squeegees provided above the mask plate in a vertical direction and arranged in a horizontal direction, and one of which is selectively controlled to move in the horizontal direction in abutment against the mask plate so that the selected one of the pair of squeegees slides on the mask plate, the mask plate including a kneading area and a substrate contact area, the kneading area is a region where a lower surface of the mask plate is in contact with the pair of clampers, and the substrate contact area is a region where a lower surface of the mask plate is in contact with the substrate, the method comprising:
   a first step of bringing only one squeegee of the pair of squeegees into abutment against the mask plate within the kneading area;
   a second step of scrapping the paste within the kneading area by the one squeegee after the first step;
   a third step of lifting up the one squeegee after the second step;
   a fourth step of bringing only the other squeegee of the pair of squeegees into abutment against the mask plate within the kneading area after the third step;
   a fifth step of scrapping the paste within the kneading area by the other squeegee after the fourth step;
   a sixth step of lifting up the other squeegee after the fifth step; and a seventh step of sliding the one squeegee on the substrate contact area after the sixth step.

2. The paste kneading method according to claim 1, further comprising:
setting abutment points where the pair of squeegees are brought into abutment against the mask plate within the kneading area desirably respectively.

3. The paste kneading method according to claim 1, further comprising:
executing the paste kneading operation including the first to sixth steps a number of times continuously.

4. The paste kneading method according to claim 3, further comprising:
setting the number of times of repetition of the paste kneading operation.

5. The paste kneading method according to claim 3, further comprising:
setting a repetition time of the paste kneading operation.

6. The paste kneading method according to claim 1, further comprising:
setting a sliding speed of each of the squeegees on the mask plate in the paste kneading operation.

7. The paste kneading method according to claim 1, further comprising:
setting a printing pressure of each of the squeegees against the mask plate in the paste kneading operation.

8. The paste kneading method according to claim 1, further comprising:
setting an execution timing of the paste kneading operation.

9. The paste kneading method according to claim 1, wherein the kneading area of the mask plate is an area where one of the pair of clampers is in contact with the mask plate; and
wherein an abutment point where the other squeegee is brought into abutment against the mask plate within the kneading area is set at a position closer to the one squeegee than a point which is immediately under a lower end of the other squeegee at a time when scraping the paste within the kneading area by the one squeegee has been completed.

10. The paste kneading method according to claim 1,
wherein the first step to the sixth step are performed before a screen printing operation of printing the paste on the substrate through pattern openings of the mask plate.

\* \* \* \* \*